United States Patent
Yeh et al.

(10) Patent No.: US 11,315,814 B2
(45) Date of Patent: Apr. 26, 2022

(54) CARRYING APPARATUS AND CARRYING METHOD

(71) Applicants: BOE TECHNOLOGY GROUP CO., LTD., Beijing (CN); Hefei Xinsheng Optoelectronics Technology Co., Ltd., Anhui (CN)

(72) Inventors: Lankai Yeh, Beijing (CN); Shupeng Guo, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 223 days.

(21) Appl. No.: 16/176,209

(22) Filed: Oct. 31, 2018

(65) Prior Publication Data
US 2019/0214286 A1   Jul. 11, 2019

(30) Foreign Application Priority Data

Jan. 9, 2018   (CN) .......................... 201810019376.5

(51) Int. Cl.
*H01L 21/673*     (2006.01)
*H01L 35/32*      (2006.01)
(Continued)

(52) U.S. Cl.
CPC ........ *H01L 21/67346* (2013.01); *C23C 14/50* (2013.01); *H01L 21/67109* (2013.01); *H01L 21/67248* (2013.01); *H01L 21/67253* (2013.01); *H01L 21/67706* (2013.01); *H01L 21/6835* (2013.01); *H01L 35/02* (2013.01);
(Continued)

(58) Field of Classification Search
CPC ......... H01L 21/67346; H01L 21/67109; H01L 21/67248; H01L 21/67253; H01L 21/67706; H01L 21/6835; H01L 35/02; H01L 35/32; H01L 51/003; H01L 51/001
See application file for complete search history.

(56) References Cited

U.S. PATENT DOCUMENTS

2012/0123220 A1 * 5/2012 Iyer ............................ C09J 7/22
600/300

FOREIGN PATENT DOCUMENTS

CN          101692428 A     4/2010
CN          105575866 A     5/2016
(Continued)

OTHER PUBLICATIONS

First Office Action for Chinese Patent Application No. 201810019376.5 dated Jan. 6, 2020.

*Primary Examiner* — Seahvosh Nikmanesh
(74) *Attorney, Agent, or Firm* — Calfee, Halter & Griswold LLP

(57) ABSTRACT

The present disclosure provides a carrying apparatus and a carrying method, the carrying apparatus includes: a carrying part configured to carry an object to be carried; an adhesive assembly disposed on the carrying part, a viscosity of the adhesive assembly is variable, and the carrying apparatus is configured to selectively adhere to or separate from the object to be carried according to a change of the viscosity; and a supporting part disposed on the carrying part and configured to support the object to be carried so that the object to be carried separates from the carrying part.

12 Claims, 3 Drawing Sheets

(51) Int. Cl.
    *H01L 35/02*     (2006.01)
    *H01L 51/00*     (2006.01)
    *C23C 14/50*     (2006.01)
    *H01L 21/683*     (2006.01)
    *H01L 21/67*     (2006.01)
    *H01L 21/677*     (2006.01)

(52) U.S. Cl.
    CPC ............ *H01L 35/32* (2013.01); *H01L 51/003* (2013.01); *H01L 51/001* (2013.01); *H01L 2221/68318* (2013.01); *H01L 2221/68381* (2013.01)

(56) References Cited

FOREIGN PATENT DOCUMENTS

| | | |
|---|---|---|
| CN | 105734494 A | 7/2016 |
| CN | 206098367 U | 4/2017 |
| CN | 107393860 A | 11/2017 |
| JP | 2004346398 A | 12/2004 |

\* cited by examiner

CARRYING APPARATUS AND CARRYING METHOD

CROSS REFERENCE

This application is based upon and claims priority to Chinese Patent Application No. 201810019376.5, filed on Jan. 9, 2018, the entire contents thereof are incorporated herein by reference.

TECHNICAL FIELD

The present disclosure relates to display technique field, and in particular, to a carrying apparatus.

BACKGROUND

In the related art, the organic functional layer in the Organic Light-Emitting Diode (OLED) device is mainly produced by vacuum thermal evaporation. The evaporation material is stored in a crucible in the evaporation source, and the evaporation material is sublimated during the crucible is heated by a heater, the organic vapor is ejected from the ejecting mechanism and deposited on the evaporation surface of the substrate to form a uniform organic film on the surface of the substrate. The related evaporation equipment mostly adopts the form of the substrate with the evaporation face facing down, which can improve the utilization rate of materials and prevent dust particles generated during the evaporation process from falling on the evaporation surface. The related equipment mostly uses ordinary sticky objects to adsorb the back of the substrate to reduce bending. However the substrate is prone to be broken when the substrate is separated.

In addition to the problem of carrying the substrate when processing the substrate during the production and preparation process of the OLED device, the problem of carrying of the substrate or the device may also be involved during the preparation process of other display devices or semiconductor devices required to be processed in a high vacuum.

There is a need in the related art for a carrying apparatus that can be used to carry substrates or other devices during high vacuum evaporation processes.

SUMMARY

According to one aspect of the present disclosure, a carrying apparatus is provided, which includes: a carrying part configured to carry an object to be carried; an adhesive assembly disposed on the carrying part, a viscosity of the adhesive assembly is variable, and the carrying apparatus is configured to selectively adhere to or separate from the object to be carried according to a change of the viscosity; and a supporting part disposed on the carrying part and configured to support the object to be carried so that the object to be carried separates from the carrying part.

In an embodiment, the adhesive assembly further comprises a variable temperature element and a thermal sensitive adhesive disposed on the variable temperature element, a temperature change of the variable temperature element causes the viscosity of the thermal sensitive adhesive to be changed so that the thermal sensitive adhesive is selectively adhere to or separate from the object to be carried.

In an embodiment, there are multiple supporting parts and multiple adhesive assembles, and the supporting part and the adhesive assembly are alternately disposed.

In an embodiment, the variable temperature element comprises a Peltier semiconductor element.

In an embodiment, the Peltier semiconductor element comprises a semiconductor layer, a first conductive layer and a second conductive layer respectively disposed on an upper surface and a lower surface of the semiconductor layer, a first insulating layer disposed on a surface of the first conductive layer away from the semiconductor layer and a second insulating layer disposed on a surface of the second conductive layer away from the semiconductor layer.

In an embodiment, the semiconductor layer comprises a first semiconductor element and a second semiconductor element forming a pair of galvanic couples.

In an embodiment, the first semiconductor element comprises an n-type semiconductor material and the second semiconductor element comprises a p-type semiconductor material.

In an embodiment, the carrying apparatus further comprises a power supply device connected to the Peltier semiconductor element to supply a variable direction current to the Peltier semiconductor element to heat and cool the Peltier semiconductor element.

In an embodiment, the supporting part is movable upwardly and downwardly with respect to the carrying part.

In an embodiment, the carrying apparatus further comprises a driving mechanism connected to the supporting part for driving the supporting part move up and down with respect to the carrying part.

In an embodiment, the carrying part comprises a first supporting plate and a second supporting plate, a plurality of through-holes are formed in the first supporting plate, and the thermal sensitive adhesive is disposed on an upper surface of the first supporting plate, the second supporting plate is movably disposed below the first supporting plate, the supporting part is disposed on an upper surface of the second supporting plate and one to one corresponds to the plurality of through holes, the driving mechanism drives the second supporting plate to move up and down relative to the first supporting plate to drive the second supporting plate to rise, so that the supporting part passes through the through-hole and protrudes from the upper surface of the first supporting plate, or, drive the second supporting plate to descent, so that the supporting part enters the through-hole and doesn't protrude from the upper surface of the first supporting plate.

In an embodiment, the supporting part comprises a first supporting portion and a second supporting portion, the second supporting portion is in contact with the carrying part, the first supporting portion is disposed on the second supporting portion, the first supporting portion has flexibility and the second supporting portion has rigidity.

According to another aspect of the present disclosure, a carrying method is provided, which uses a carrying apparatus to carry an object to be carried, and the carrying apparatus includes:

a carrying part configured to carry an object to be carried;

an adhesive assembly disposed on the carrying part, a viscosity of the adhesive assembly is variable, and the carrying apparatus is configured to selectively adhere to or separate from the object to be carried according to a change of the viscosity; and a supporting part disposed on the carrying part and configured to support the object to be carried so that the object to be carried separates from the carrying part;

the carrying method comprises:

placing the object to be carried on the carrying part; and moving the supporting part so that a top end of the supporting part is not higher than an upper surface of the adhesive assembly, adjusting the viscosity of the adhesive assembly such that the substrate is adhered by the adhesive assembly; or, adjusting the viscosity of the adhesive assembly such that the substrate is not adhered by the adhesive assembly, moving the supporting part so as to support the object to be carried such that the object to be carried is separated from the carrying part.

In an embodiment, the adhesive assembly further comprises a variable temperature element and a thermal sensitive adhesive disposed on the variable temperature element, a temperature change of the variable temperature element causes the viscosity of the thermal sensitive adhesive to be changed;

the carrying method comprises:

moving the supporting part so that the top end of the supporting part is not higher than the upper surface of the adhesive assembly, increasing the temperature of the variable temperature element, thereby, the viscosity of the thermal sensitive adhesive is increased, so that the substrate is adhered by the adhesive assembly; or, reducing the temperature of the variable temperature element until the thermal sensitive adhesive loses viscosity, moving the supporting part so as to support the object to be carried such that the object to be carried is separated from the carrying part.

BRIEF DESCRIPTION OF THE DRAWINGS

FIG. 2a and FIG. 2b are schematic views of an adhesive assembly according to an embodiment of the present disclosure, wherein, FIG. 2a shows that the element of the adhesive assembly is separated from a thermal sensitive adhesive, and FIG. 2b shows that the thermal sensitive adhesive of the adhesive assembly covers on the element.

DETAILED DESCRIPTION

Figure 1:
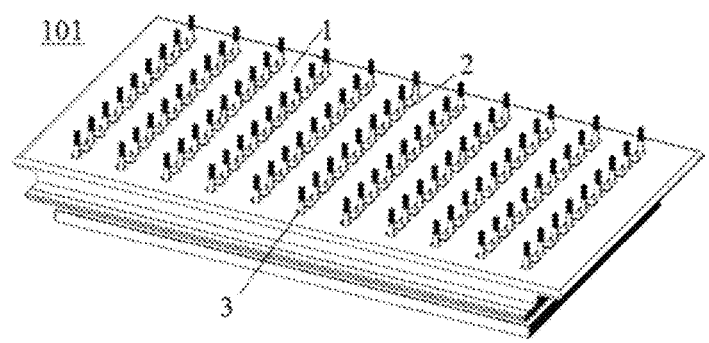
FIG. 1 is a schematic view of a carrying apparatus according to an embodiment of the present disclosure.

The present disclosure will be further described in detail below in conjunction with the accompanying drawings and embodiments. It is understood that the specific embodiments described herein are merely illustrative of the disclosure and are not intended to be limiting. It is also to be noted that, for the convenience of description, only some but not all of the structures related to the present disclosure are shown in the drawings.

The embodiment provides a carrying apparatus, and FIG. 1 is a schematic view of the carrying apparatus according to the present embodiment.

As shown in FIG. 1, the carrying apparatus 101 includes: a carrying part 1 for carrying an object to be carried, the object to be carried here is generally a substrate of a display device, and may also be other devices, in the following description, a substrate to be an OLED is taken as an example, but the embodiment is not limited thereto; an adhesive assembly 2 disposed on the carrying part, the viscosity of the adhesive assembly is variable to realize adhesion and separation of the object to be carried and the carrying apparatus; and a supporting part 3 disposed on the carrying part 1 is configured to support the object to be carried.

Figures 2A, 2B:
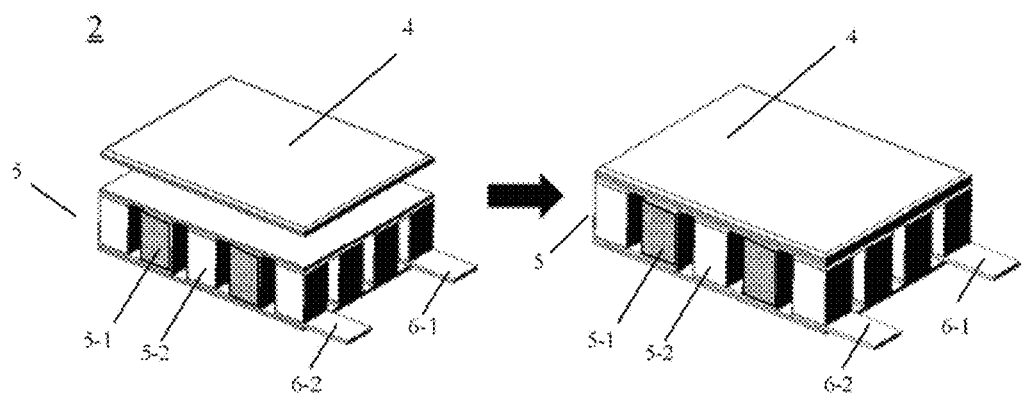

FIG. 2 is a schematic view of the adhesive assembly according to the embodiment of the present disclosure. As shown in FIG. 2, the adhesive assembly 2 according to the embodiment includes a variable temperature element 5 and a thermal sensitive adhesive 4 disposed on the variable temperature element 5. The viscosity of the thermal sensitive adhesive 4 is changed by the temperature change of the variable temperature element 5. As shown in FIG. 2a, the variable temperature element 5 is covered with the thermal sensitive adhesive 4, the thermal sensitive adhesive 4 and the variable temperature element 5 is separable; as shown in FIG. 2b, the thermal sensitive adhesive 4 covers on the variable temperature element 5.

The variable temperature element 5 may include a Peltier semiconductor element. The Peltier semiconductor element may include a semiconductor layer 11, the semiconductor layer 11 may include a galvanic couple formed of a p-type semiconductor material and an n-type semiconductor material, in the embodiment, the semiconductor layer 11 includes a first semiconductor element 5-1 and a second semiconductor element 5-2, the first semiconductor element 5-1 includes an n-type semiconductor material and the second semiconductor element 5-2 includes a p-type semiconductor material. The variable temperature element 5 further includes a first conductive layer 8-1 and a second conductive layer 8-2 respectively disposed on an upper surface and a lower surface of the semiconductor layer 11, and a first insulating layer 7-1 and a second insulating layer 7-2 respectively disposed on a surface of the first conductive layer 8-1 and the second conductive layer 8-2 away from the semiconductor layer 11.

The variable temperature element 5 further includes a first electrode terminal 6-1 connected to the first semiconductor element 5-1 and a second electrode terminal 6-2 connected to the second semiconductor element 5-2, the first electrode terminal 6-1 and the second electrode terminal 6-2 are connected to an external power source such that the current passes through the first and second semiconductor elements, and it possible to change the temperature of the variable temperature element 5 based on the Peltier effect by changing the polarity of the electrodes connected to the electrode terminal.

Figure 3:
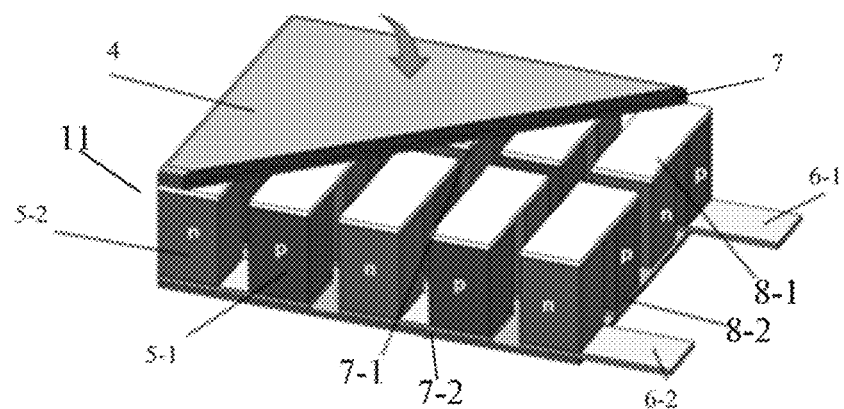
FIG. 3 is a schematic view of the adhesive assembly according to embodiment of the present disclosure.

As shown in FIG. 3, at this time, the first electrode terminal 6-1 is connected to the positive pole of the power source, and the second electrode terminal 6-2 is connected to the negative pole of the power source. Based on the Peltier effect, the current flows from the first electrode terminal 6-1 connected to the first semiconductor element 5-1 to the second electrode terminal 6-2 connected to the second semiconductor element 5-2, the heat is released so that the temperature of the variable temperature element 5 is increased, thusly the viscosity of the thermal sensitive adhesive 4 which contacts with the variable temperature element 5 being increased.

Figure 4:
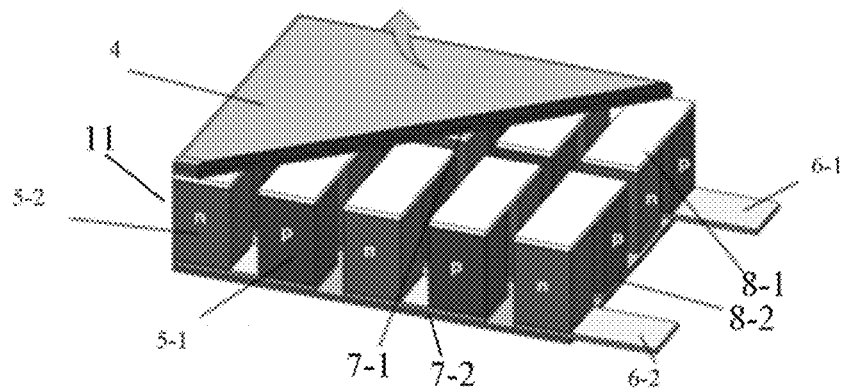
FIG. 4 is a schematic view of the adhesive assembly according to an embodiment of the present disclosure.

As shown in FIG. 4, at this time, the first electrode terminal 6-1 is connected to the negative pole of the power source, and the second electrode terminal 6-2 is connected to the positive pole of the power source, the current flows from the second electrode terminal 6-2 connected to the second semiconductor element 5-2 to the first electrode terminal 6-1 connected to the first semiconductor element 5-1, the heat is absorbed so that the temperature of the variable temperature element 5 is reduced, thusly the viscosity of the thermal sensitive adhesive 4 which contacts with the variable temperature element 5 being lost.

The supporting part 3 and the adhesive assembly are alternately disposed, and the supporting part 3 may be up and down. When the supporting part 3 is raised, the substrate can be lifted for handling; when the supporting part 3 is dropped, the top end of the supporting part 3 is on the same level as or lower than the surface of the adhesive assembly 2, at this time, the adhesive assembly 2 is in contact with the substrate to achieve adhesion to the substrate.

The carrying apparatus further includes a driving mechanism (no shown in the figures) connected to the supporting part 3 for driving the supporting part 3 to move up and down. The driving mechanism can drive the respective supporting parts to move synchronously, or drive the supporting parts 3 to move independently.

Figure 5:
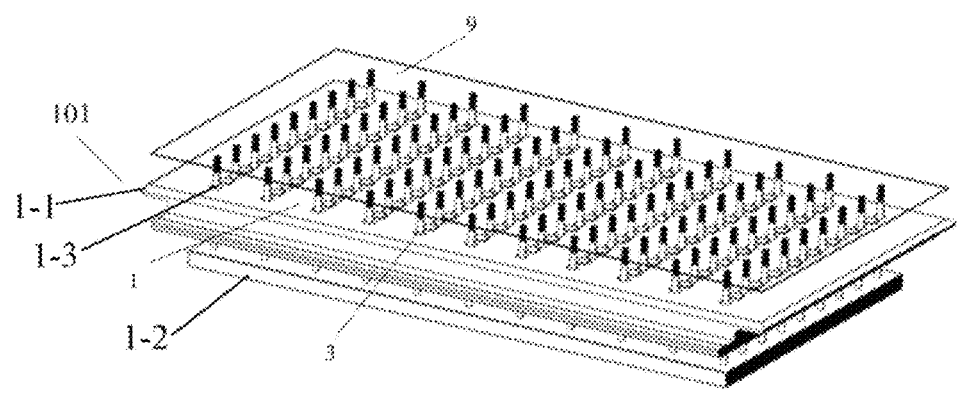
FIG. 5 is a schematic view showing that the carrying apparatus carries an object to be carried according to an embodiment of the present disclosure.

In the embodiment, as shown in FIG. 1 and FIG. 5, the carrying part 1 includes a first supporting plate 1-1 and a second supporting plate 1-2, a plurality of through-holes 1-3 are formed in the first supporting plate 1-1, and the thermal sensitive adhesive 4 is disposed on the upper surface of the first supporting plate 1-1, for example, alternately arranged with the through-holes 1-3. The second supporting plate 1-2 is movably disposed below the first supporting plate 1-1, the supporting part 3 is disposed on the upper surface of the second supporting plate 1-2 and one to one corresponds to the plurality of through holes 1-3, the driving mechanism can drive the second supporting plate 1-2 to move up and down relative to the first supporting plate 1-1 to drive the second supporting plate 1-2 to rise, so that the supporting part 3 passes through the through-hole 1-3 and protrudes from the upper surface of the first supporting plate 1-1, or, drive the second supporting plate 1-2 to descent, so that the supporting part 3 enters the through-hole 1-3 and doesn't protrude from the upper surface of the first supporting plate 1-1.

Figure 6:
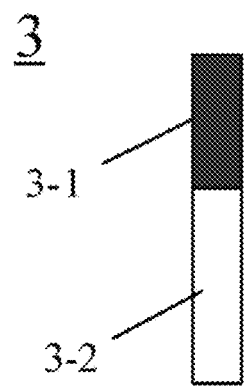
FIG. 6 is a side view of a supporting part according to an embodiment of the present disclosure.

In addition, FIG. 6 shows a side view of the supporting part according to the present embodiment. As shown in FIG. 6, the supporting part 3 includes a first supporting portion 3-1 and a second supporting portion 3-2, the second supporting portion 3-2 is in contact with the carrying part 3, the first supporting portion 3-1 is disposed on the second supporting portion 3-2. The first supporting portion 3-1 has flexibility, when the substrate is carried, the first supporting portion 3-1 is in contact with the substrate to reduce the damage to the substrate, and the second supporting portion 3-2 has rigidity to provide a firm support.

Next, the operation of the carrying apparatus carrying the substrate according to the present embodiment will be described in detail with reference to FIG. 5. FIG. 5 is a schematic view of the carrying apparatus carrying an object to be carried according to an embodiment of the present disclosure.

The carrying apparatus 101 carrying the substrate 9 enters the adsorption/disengagement position where the substrate is subjected to processing. The substrate 9 needs to be stably fixed to the carrying apparatus during the process. When the substrate needs to be adhered, the supporting part 3 is descended, and the top end of the supporting part 3 is on the same level as the adhesive assembly 2, and the adhesive assembly 2 is in contact with the substrate 9 at this time, based on the Peltier effect, the temperature of the semiconductor element in the adhesive assembly 2 is raised, and then the temperature of the adhesive assembly 2 is raised to increase the viscosity of the thermal sensitive adhesive, and the substrate is adhered to the surface of the thermal sensitive adhesive to stably fix the substrate to the carrying apparatus. The way of heating the elements of the adhesive assembly 2 has been described above and will not be described herein.

When the processing of the substrate is completed and the substrate needs to be separated, the variable temperature element in the adhesive assembly 2 is cooled, and the temperature of the adhesive assembly 2 is lowered to make the thermal sensitive adhesive 4 lose its viscosity, the thermal sensitive adhesive is separated from the substrate, the supporting part 3 is raised, the substrate 9 is lifted up by the supporting part 3, and then removed by the mechanical arm, and the supporting part 3 is falls back again.

The carrying apparatus further includes a power supply device (not shown in the figures) connected to the Peltier semiconductor element to supply a variable direction current to the Peltier semiconductor element to heat and cool the Peltier semiconductor element.

The Peltier semiconductor elements are used as semiconductor refrigeration sheets, which have very low thermal inertia and fast cooling and heating time, in the case where the hot end is well cooled and the cold end is unloaded, power on for less than one minute, the cooling sheet can reach the maximum temperature difference.

According to the carrying apparatus of the embodiment, the fixing of the substrate in a vacuum environment is achieved by using a variable viscosity thermal sensitive adhesive and a variable temperature semiconductor element; the variable viscosity thermal sensitive adhesive adheres to the substrate, the substrate with the processing surface facing down can be used to complete its related processes; the viscosity of the thermal sensitive adhesive is changed by the thermoelectric cooling/heating due to the Peltier effect, such that the adsorption and separation process of the substrate is completed; both substrate adsorption and separation operations can be performed in a vacuum environment; moreover, the thermal inertia of the semiconductor element is very small, therefore, the cooling and heating time is fast, thusly the adsorption and separation of the substrate can be quickly realized.

It should be understood by those skilled in the art that the present disclosure is not limited to the specific embodiments described herein, and that various modifications, changes and substitutions may be made without departing from the scope of the disclosure. Therefore, although the present disclosure has been described in detail by the above embodiments, the present disclosure is not limited to the above embodiments, and further embodiments may be included without departing from the inventive concept, the scope is determined by the appended claims.

What is claimed is:

1. A carrying apparatus, comprising:
   a carrying part configured to carry an object to be carried;
   an adhesive assembly disposed on the carrying part, wherein a viscosity of the adhesive assembly is variable, and the carrying apparatus is configured to selectively adhere to or to separate from the object to be carried according to a change of the viscosity; and
   a supporting part disposed on the carrying part and configured to support the object to be carried so that the object to be carried separates from the carrying part;
   wherein there are multiple supporting parts and multiple adhesive assembles, and the supporting part and the adhesive assembly are alternately disposed and distributed in an array on the carrying part; the supporting part comprises a first supporting portion and a second supporting portion, the second supporting portion is in contact with the carrying part, the first supporting portion is disposed on the second supporting portion, the first supporting portion has flexibility and the second supporting portion has rigidity.

2. The carrying apparatus according to claim 1, wherein the adhesive assembly further comprises a variable temperature element and a thermal sensitive adhesive disposed on the variable temperature element, a temperature change of the variable temperature element causes the viscosity of the thermal sensitive adhesive to be changed so that the thermal sensitive adhesive is selectively adhere to or separate from the object to be carried.

3. The carrying apparatus according to claim 1, wherein the variable temperature element comprises a Peltier semiconductor element.

4. The carrying apparatus according to claim 2, wherein the variable temperature element comprises a Peltier semiconductor element.

5. The carrying apparatus according to claim 3, wherein the Peltier semiconductor element comprises a semiconductor layer, a first conductive layer and a second conductive layer respectively disposed on an upper surface and a lower surface of the semiconductor layer, a first insulating layer disposed on a surface of the first conductive layer away from the semiconductor layer and a second insulating layer disposed on a surface of the second conductive layer away from the semiconductor layer.

6. The carrying apparatus according to claim 5, wherein the semiconductor layer comprises a first semiconductor element and a second semiconductor element forming a pair of galvanic couples.

7. The carrying apparatus according to claim 5, wherein the first semiconductor element comprises an n-type semiconductor material and the second semiconductor element comprises a p-type semiconductor material.

8. The carrying apparatus according to claim 3, wherein the carrying apparatus further comprises a power supply device connected to the Peltier semiconductor element to supply a variable direction current to the Peltier semiconductor element to heat and cool the Peltier semiconductor element.

9. The carrying apparatus according to claim 1, wherein the supporting part is movable upwardly and downwardly with respect to the carrying part.

10. The carrying apparatus according to claim 2, wherein the supporting part is movable upwardly and downwardly with respect to the carrying part.

11. The carrying apparatus according to claim 9, wherein the carrying apparatus further comprises a driving mechanism connected to the supporting part for driving the supporting part move up and down with respect to the carrying part.

12. The carrying apparatus according to claim 11, wherein the carrying part comprises a first supporting plate and a second supporting plate, a plurality of through-holes are formed in the first supporting plate, and the thermal sensitive adhesive is disposed on an upper surface of the first supporting plate, the second supporting plate is movably disposed below the first supporting plate, the supporting part is disposed on an upper surface of the second supporting plate and one to one corresponds to the plurality of through holes, the driving mechanism drives the second supporting plate to move up and down relative to the first supporting plate to drive the second supporting plate to rise, so that the supporting part passes through the through-hole and protrudes from the upper surface of the first supporting plate, or, drives the second supporting plate to descent, so that the supporting part enters the through-hole and doesn't protrude from the upper surface of the first supporting plate.

* * * * *